United States Patent [19]

Mori

[11] Patent Number: 5,150,178
[45] Date of Patent: Sep. 22, 1992

[54] GATE STRUCTURE FOR A SEMICONDUCTOR MEMORY DEVICE

[75] Inventor: Seiichi Mori, Tokyo, Japan

[73] Assignee: Kabushiki Kaisha Toshiba, Kawasaki, Japan

[21] Appl. No.: 690,660

[22] Filed: Apr. 24, 1991

[30] Foreign Application Priority Data

Apr. 24, 1990 [JP] Japan .................. 2-106377

[51] Int. Cl.⁵ .............. H01L 29/68; H01L 23/48; H01L 29/06; H01L 29/04
[52] U.S. Cl. .................. 357/23.5; 357/71; 357/67; 357/55; 357/59
[58] Field of Search ......... 357/23.5, 715, 67, 55, 357/59 I

[56] References Cited

U.S. PATENT DOCUMENTS 4,847,673 7/1989 Matsukawa ............ 357/55

FOREIGN PATENT DOCUMENTS

0160965A3 11/1985 European Pat. Off.
0236676A2 9/1987 European Pat. Off.
62-128567 7/1987 Japan.

OTHER PUBLICATIONS

IEDM Technical Digest, p. 557 (1987), "Novel Process and Device Technologies for Submicron 4Mb CMOS EPROMs", Dec. 6 (1987), S. Mori et al.

Primary Examiner—Rolf Hille
Assistant Examiner—Robert Limanek
Attorney, Agent, or Firm—Banner, Birch, McKie & Beckett

[57] ABSTRACT

In a semiconductor memory device of multistage gate structure, the second stage gate electrode (control gate electrode) is of superposed-layer structure of a second polysilicon layer and a high melting point layer or a silicide layer of a high melting point metal layer formed thereon. Those portions of the second polysilicon layer which are above the element forming regions have a thickness larger than ½ the width of grooves formed between adjacent first gate electrodes (floating gate electrodes), so that the grooves are filled with the second polysilicon layer to flatten the surfaces of those portions of the second polysilicon layer which are above the grooves.

12 Claims, 4 Drawing Sheets

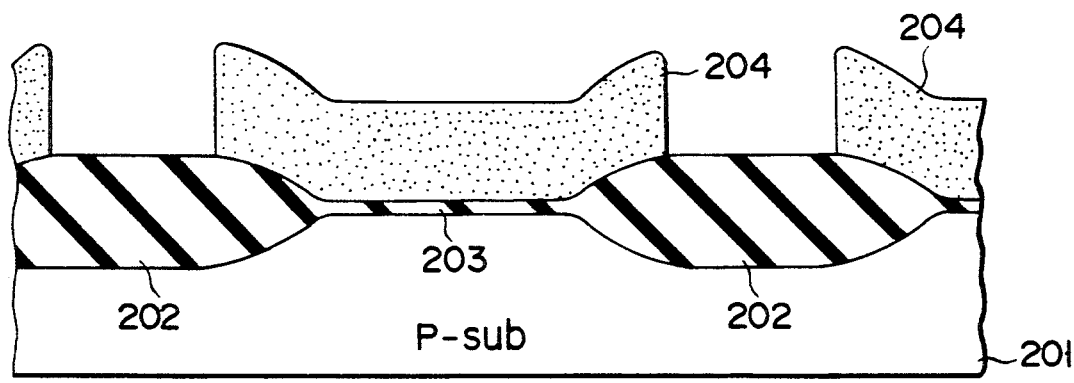
F I G. 2A
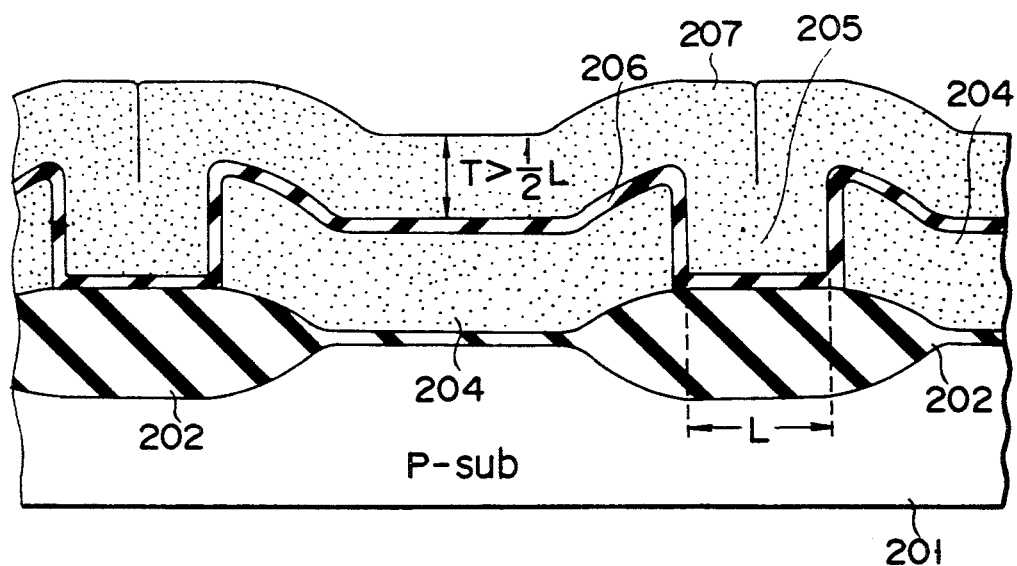
F I G. 2B

GATE STRUCTURE FOR A SEMICONDUCTOR MEMORY DEVICE

BACKGROUND OF THE INVENTION

1. Field of the Invention

The present invention relates to a semiconductor memory device and a method of manufacturing the same and, more particularly, to a semiconductor memory device having gate electrode layers of multistage structure such as an EPROM (electrically programmable read only memory) or EEPROM (electrically erasable and programmable read only memory) in which the control gate electrode is of superposed-layer structure of a polysilicon layer and a refractory metal layer (a high melting point metal layer) or a silicide layer thereof.

2. Description of the Related Art

Conventionally, an EPROM cell is formed by a method as shown in FIGS. 1A-1C.

As shown in FIG. 1A, a field oxide film 2 serving as an element isolation region is formed on a major surface of a p-type silicon substrate 1 to form island regions used as element forming regions. A first gate oxide film 4 is formed on the island regions of the substrate 1. A first polysilicon layer 5 serving as a first level gate electrode (floating gate electrode) is formed on the resultant semiconductor structure.

Thereafter, as shown in FIG. 1B, the polysilicon layer 5 is patterned to form floating gate electrodes 6. By the patterning, a channel or groove 9 is formed between adjacent floating gate electrodes 6. The resultant semiconductor structure is thermally oxidized to form a second gate oxide film 7.

Thereafter, as shown in FIG. 1C, a second polysilicon layer serving as a second level gate electrode (control gate electrode) is formed on the resultant semiconductor structure and patterned to form a control gate electrode 8.

Thereafter, though not shown, an n-type impurity is ion-implanted in the substrate using the control gate 8 as a mask and activated to form n+-type source and drain regions. Thereafter, a CVD-$SiO_2$ film, a contact hole, and an Al wiring layer are sequentially formed, thus manufacturing a EPROM cell.

With the above conventional method, however, the second polysilicon layer has a recess above the separating groove 9. In recent years, in order to increase the operation speed of an element, a refractory metal layer (a high melting point metal layer) or the silicide layer thereof is formed on the second polysilicon layer. However, when a refractory metal layer or the silicide layer thereof is superposed on the second polysilicon layer, the metal layer or the silicide layer has the recess above the separating groove 9. Therefore, when the semiconductor structure is subjected to thermal heating at a later step, the metal layer or the silicide layer often cracks at the step portions of the recess because of a mechanical stress, resulting in disconnection of the metal layer or the silicide layer.

Furthermore, when these layers are formed by a general method such as a sputtering method, the sputtering cannot be performed in the groove with sufficient uniformity, and the thickness of the film may be decreased to increase the resistance thereof.

Moreover, when the control gate layer is etched, the refractory metal or the refractory metal silicide layer and the first polysilicon layer are etched. In this case, when the refractory metal layer or the refractory metal silicide layer and the first polysilicon layer are etched, etching conditions are preferably often changed from a point of view of an etching shape and selectivity of the an underlying insulating film. In this case, if the groove is filled with the refractory metal or the refractory metal silicide, since the refractory metal or the refractory metal silicide layer located at the step portion of the groove is removed by etching, over-etching must be sufficiently performed especially when anisotropic etching is used. Therefore, during this over-etching, the flat underlying polysilicon layer may be disadvantageously etched.

SUMMARY OF THE INVENTION

The present invention has been made in consideration of the above problem, and has as its object to flatten the refractory metal or the refractory metal silicide layer of the gate of the second level layer to avoid occurrence of cracks thereof and reduce an increase in resistance thereof.

According to the present invention, there is provided a semiconductor memory device of multistage gate structure, comprising:

a semiconductor substrate;

a field oxidation film of a predetermined pattern formed on said semiconductor substrate, for defining element forming regions in which semiconductor elements are formed;

first gate electrodes formed on said element forming regions, the first gate electrodes being separated from each other by a predetermined width;

an insulating film formed on the semiconductor structure to define grooves having substantially the same width between said first gate electrodes; and a second gate electrode of superposed-layer structure formed on said insulating film, made of a polysilicon layer formed on said insulating film and a high melting point metal layer or a silicide layer of a high melting point metal formed on the polysilicon layer, surfaces of those portions of said polysilicon layer which are above said grooves being substantially flat.

According to the present invention, there is further provided a method of manufacturing a semiconductor memory device of multistage gate structure, comprising the steps of:

forming on a semiconductor substrate first gate electrodes being separated from each other by a predetermined width;

forming an insulating film on the resultant semiconductor structure to define grooves having substantially the same width between said first gate electrodes; and forming a second gate electrode of superposed-layer structure on said insulating film, made of a polysilicon layer formed on said insulating film and a high melting point metal layer or a silicide layer of a high melting point metal formed on the polysilicon layer, those portions of said polysilicon layer which are above said element forming regions having a thickness larger than ½ said width of said grooves so that said grooves are filled with said polysilicon layer to substantially flatten surfaces of those portions of said polysilicon layer which are above said grooves.

That is, according to the present invention, when an upper gate layer (a gate electrode of the second level layer) is formed as a layer of superposed-layer structure made of a refractory metal or a refractory metal silicide layer (upper layer) and polysilicon layer (lower layer), the thickness of the lower polysilicon layer is made larger than ½ a width of the underlying groove in order to fill the groove with the polysilicon layer so that the surface of that portion of the lower polysilicon which is above the groove is flat.

BRIEF DESCRIPTION OF THE DRAWINGS

FIGS. 2A–2C are views showing steps in manufacturing a semiconductor memory device according to an embodiment of the present invention;

DETAILED DESCRIPTION OF THE PREFERRED EMBODIMENTS

Figure 1A:
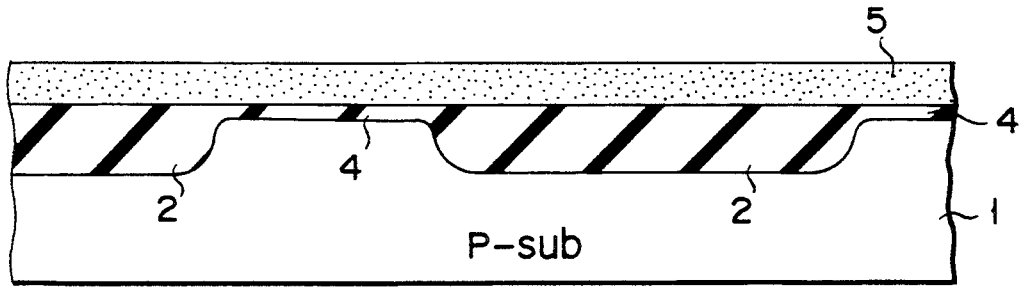
FIGS. 1A–1C are views showing steps for obtaining a conventional EPROM.
Figure 1B:
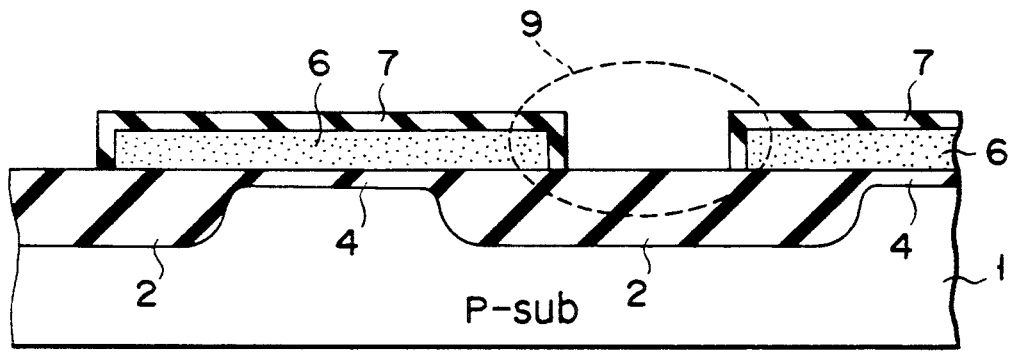
Figure 1C:
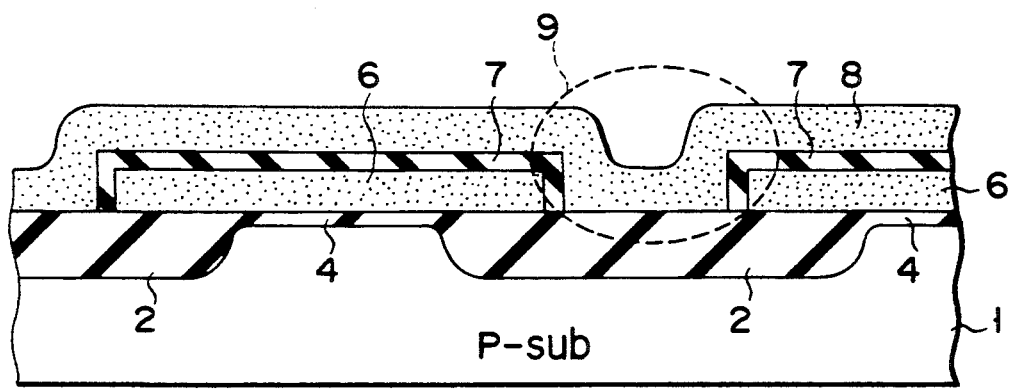

Manufacturing methods wherein the present invention is applied to an EPROM cell array will be described below with reference to FIGS. 2A–2C and 3–5.

As shown in FIG. 2A, on a p-type silicon substrate 201, an element isolation oxide film (field oxidation film) 202 having a thickness of 500 nm is formed by a known method such as LOCOS (local oxidation of silicon), and a first gate oxide film 203 having a thickness of 20 nm is formed by a well-known method such as thermal oxidation. A first polysilicon layer 204 forming a floating gate electrode of a first level layer is formed thereon to have a thickness of, e.g., 400 nm by a known method such as CVD (chemical vapor deposition). In order to use the polysilicon layer 204 as floating gate electrodes, the first polysilicon layer 204 is selectively removed by 0.6 $\mu$m in width by means of photolithography and etching.

Thereafter, as shown in FIG. 2B, a first oxide film 206 is formed over the semiconductor structure by a known method such as a thermal oxidation method to isolate the gate electrodes 20 of the first level layer from a gate electrode (control gate electrode) of a second level layer formed at a later step. In this time, channels or grooves 205 defined by the oxide film 206, having substantially the same width are formed on the element isolation oxide film 202. In other words, channels or grooves 205 are formed between adjacent floating gate electrode 204. In order to form a first gate electrode of a second level layer, a polysilicon layer 207 is formed to have a thickness larger than ½ the width L of the groove 205, e.g., 300 nm (0.3 $\mu$m) on the resultant semiconductor structure by a known method such a CVD. Therefore, the groove 205 is filled with the second polysilicon film 207 so that the second polysilicon film has a flat surface over the groove.

Figure 2C:
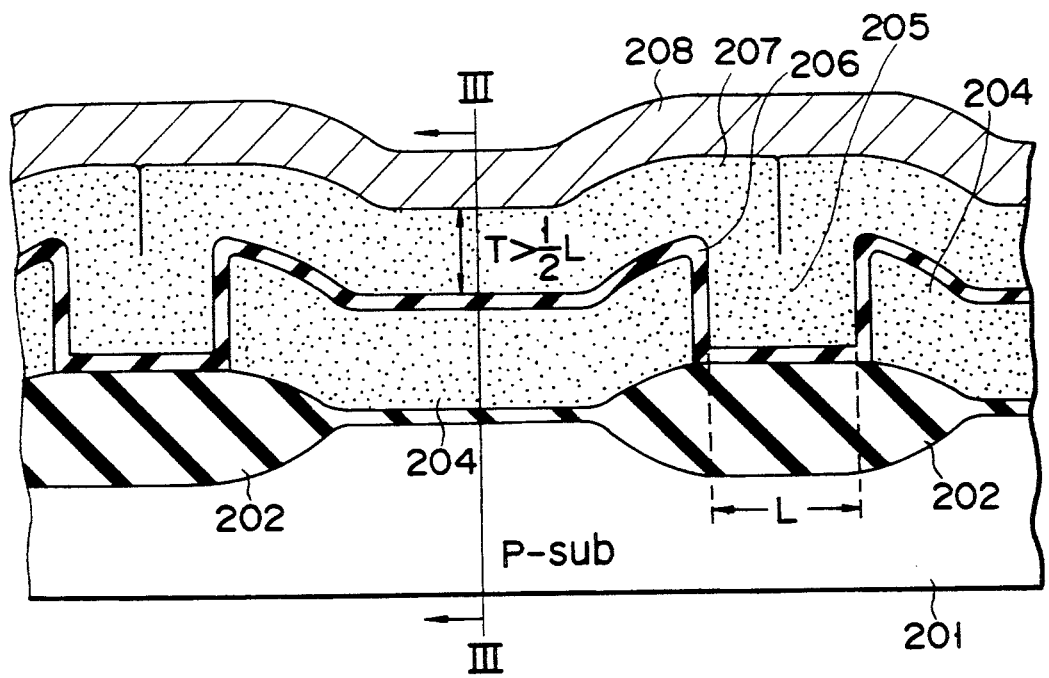

Thereafter, as shown in FIG. 2C, a refractory metal (a high melting point metal layer) or a silicide layer of a refractory metal, for example, a WSi 208 (tungsten silicide) is formed on the second polysilicon layer 207 by sputtering method to have a thickness of 20 nm.

Figure 3:
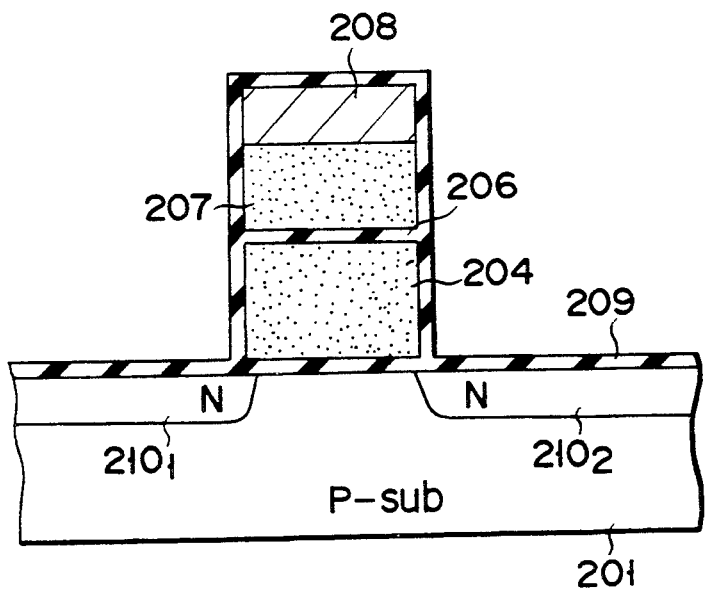
FIG. 3 is a view taken along the line III—III in FIG. 2C.

Thereafter, as shown in FIG. 3 showing a section perpendicular to the sectional view of the structure shown in FIG. 2C, the WSi layer 208 is vertically etched by a known method, and the second polysilicon layer 207 is etched by a known method. Since the etching for the polysilicon has high selectivity with the oxide film 206, the oxide film 206 is not removed during the etching step to thereby prevent the first polysilicon layer 204 from being etched.

Thereafter, the oxide film 206 is etched, and the first polysilicon layer 204 is etched. In order to form a source $210_1$ and a drain $210_2$, arsenic of an n-type impurity is doped by ion implantation. The resultant semiconductor structure is oxidized to form an oxide film 209 over the semiconductor structure. Thereafter, though not shown, an insulating interlayer is formed, a contact hole is formed therein, and a metal wiring layer is formed, thus completing a semiconductor memory device.

Figure 4:
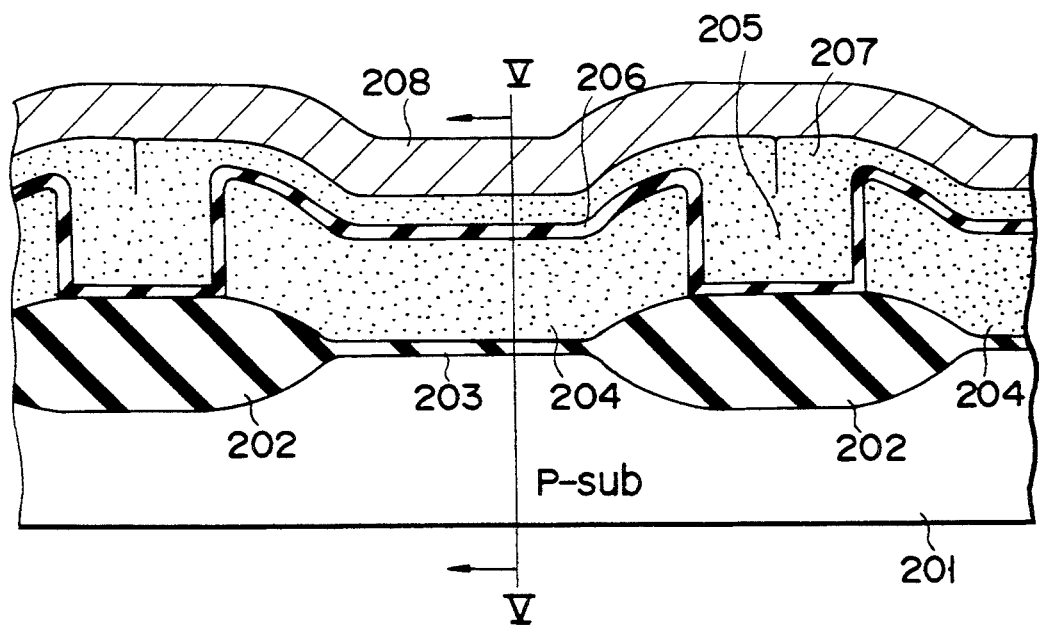
FIG. 4 is a view showing a step of modification of FIG. 2C.
Figure 5:
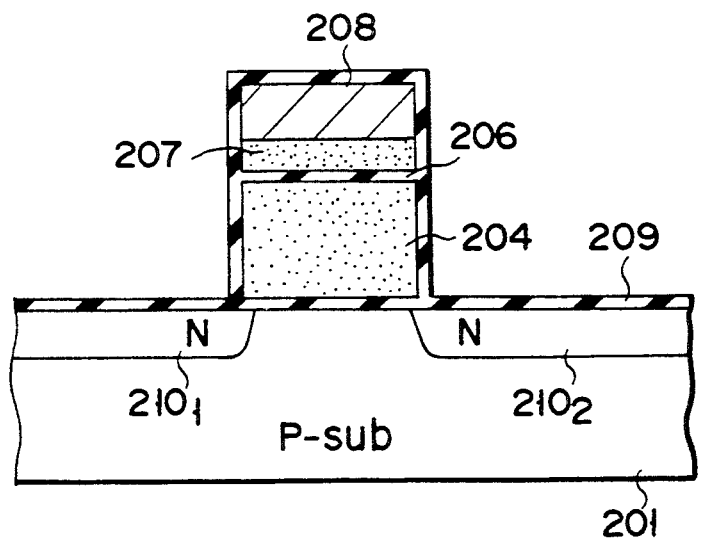
FIG. 5 is a view taken along the line V—V in FIG. 4.

The present invention is not limited to this embodiment, and various modifications can be made. For example, as shown in FIGS. 4 and 5, the second polysilicon layer 207 may be etched back by 200 nm in thickness, and then the WSi layer 208 is formed on the second polysilicon layer 207.

Moreover, in the above embodiment, the WSi layer 208 is used as the silicide layer of a refractory meal. However, a silicide layer such as TiSi, MoSi, or CoSi or a metal layer made of, e.g., W, Mo, Co, or Ti can be used instead.

Also in the above embodiment, the groove is provided between adjacent floating gate electrodes, and the thickness of the second polysilicon film is larger than ½ the width of the groove. In this case, the groove in which a crack or the like influences the performance of the device is described. However, when a wide groove is formed under a second gate electrode layer having a large length and cracks of the groove portion rarely influences the performance of the device, no polysilicon layer having a thickness larger than ½ the width of the wide groove is necessarily formed. In addition, as the second polysilicon layer of the above embodiment, a superposed-layer structure constituted by a polysilicon layer and other conductive materials can be used, when the conductive materials have the same effect as described above.

According to the present invention, as shown in FIG. 2C, since a refractory metal layer or a silicide layer thereof has a flat surface over the groove, no crack is formed in an annealing process, e.g., in a step of forming the oxide film 209 in FIG. 3. In addition, the film is formed without ununiformity. In order to process a gate electrode, when a refractory metal layer or a refractory metal silicide layer is etched, over-etching is not necessarily performed. That is, when the width of the groove is excessively increased, etching back can prevent that an upper polysilicon layer is difficult to be processed in the sequential steps due to the excessively large thickness of the polysilicon layer. Therefore, etching conditions can be easily changed, and the difficulty of processing can be largely reduced.

What is claimed is:

1. A semiconductor memory device of multistage gate structure, comprising:
   a semiconductor substrate;
   a field oxidation film of a predetermined pattern formed on said semiconductor substrate, for defining element forming regions in which semiconductor elements are formed;
   first gate electrodes formed on said element forming regions, the first gate electrodes being separated from each other by a predetermined width;
   an insulating film formed to define grooves having substantially the same width between said first gate electrodes; and a second gate electrode of superimposed-layer structure formed on said insulating film, made of a polysilicon layer formed on said insulating film and a high melting point metal layer or a silicide layer of a high melting point metal formed on the polysilicon layer, surfaces of those portions of said polysilicon layer which are above said grooves being substantially flat.

2. A semiconductor memory device according to claim 1, wherein those portions of said polysilicon layer which are above said element forming regions have a thickness larger than ½ said width of said grooves.

3. A semiconductor memory device according to claim 1 or 2, wherein said grooves are above said field oxidation film.

4. A semiconductor memory device according to claim 1 or 2, wherein said high melting point metal is one selected from a group of tungsten, molybdenum, copper, and titanium.

5. A semiconductor memory device, comprising:
a semiconductor substrate having semiconductor element regions;
first gate electrodes formed on said semiconductor element regions;
an insulating film formed on said first gate electrodes and defining grooves having a substantially same width between said first gate electrodes; and
a second gate electrode formed on said insulating film, said second gate electrode comprising (1) a polysilicon layer formed on said insulating film and filling in said grooves and (2) one of eight a high melting point metal layer and a silicide layer of a high melting point melting on said polysilicon layer, a surface portion of said polysilicon layer at positions corresponding to said grooves being substantially planar.

6. The semiconductor memory device according to claim 9, further comprising:
source and drain regions formed in said semiconductor element regions, said first gate electrodes extending between said source and drain regions.

7. The semiconductor memory device according to claim 5, wherein said semiconductor element regions are defined by a field oxidation film formed on said semiconductor substrate, said first gate electrodes extending onto said field oxidation film.

8. A semiconductor memory device, comprising:
a semiconductor substrate;
a field oxidation film formed on said semiconductor substrate and defining semiconductor element regions;
source and drain regions formed in said semiconductor element regions;
first gate electrodes having a predetermined separation therebetween and formed on said semiconductor element regions to extend between said source and drain regions thereof;
an insulating film formed on said first gate electrodes and defining grooves having a substantially same width between said first gate electrodes; and
a second gate electrode formed on said insulating film, said second gate electrode comprising (1) a polysilicon layer formed on said insulating film and filling in said grooves and (2) one of either a high melting point metal layer and a silicide layer of a high melting point metal on said polysilicon layer, a surface portion of said polysilicon layer at positions corresponding to said grooves being substantially planar.

9. The semiconductor memory device according to claim 8, wherein portions of said polysilicon layer above said semiconductor element regions have a thickness greater than one-half a width of said grooves.

10. The semiconductor memory device according to claim 8, wherein said grooves are above said field oxidation film.

11. The semiconductor memory device according to claim 8 or 9, wherein said high melting point metal is one selected from a group consisting of tungsten, molybdenum, copper, and titanium.

12. The semiconductor memory device according to claim 8 or 9, wherein said silicide layer is one selected from a group consisting of WSi, TiSi, MoSi, and CoSi.

* * * * *

UNITED STATES PATENT AND TRADEMARK OFFICE
CERTIFICATE OF CORRECTION

PATENT NO.   : 5,150,178
DATED        : September 22, 1992
INVENTOR(S)  : Seiichi Mori It is certified that error appears in the above-identified patent and that said Letters Patent is hereby corrected as shown below:

Column 5,
Line 32, change "eight" to -- either --;
Line 34, change the second occurrence of "melting" to -- metal --.

Signed and Sealed this

Seventh Day of March, 2006

JON W. DUDAS
*Director of the United States Patent and Trademark Office*